United States Patent [19]
Lim

[11] Patent Number: 5,817,563
[45] Date of Patent: Oct. 6, 1998

[54] METHOD FOR FABRICATING AN LDD TRANSISTOR

[75] Inventor: Geun Lim, Jeonrabuk-do, Rep. of Korea

[73] Assignee: LG Semicon Co., Ltd., Chungcheongbuk-do, Rep. of Korea

[21] Appl. No.: 655,240

[22] Filed: Jun. 5, 1996

[30] Foreign Application Priority Data

Sep. 25, 1995 [KR] Rep. of Korea ................... 31655/1995

[51] Int. Cl.⁶ ................................................ H01L 21/336
[52] U.S. Cl. ........................................... 438/307; 438/529
[58] Field of Search ................................. 438/303, 305, 438/306, 307, 529, 551

[56] References Cited

U.S. PATENT DOCUMENTS

| | | | |
|---|---|---|---|
| 4,366,613 | 1/1983 | Ogura et al. | 438/303 |
| 4,728,617 | 3/1988 | Woo et al. | 438/307 |
| 4,818,714 | 4/1989 | Haskell | 438/305 |
| 4,908,326 | 3/1990 | Ma et al. | 438/307 |

*Primary Examiner*—Chandra Chaudhari
*Attorney, Agent, or Firm*—Finnegan, Henderson, Farabow, Garrett & Dunner, L.L.P.

[57] ABSTRACT

A method for fabricating an MOS transistor of an LDD structure having reduced short channel effects and GIDL (Gate Induced Drain Leakage) including the steps of providing a semiconductor substrate, forming a field oxide film in a field region of the semiconductor substrate, forming a gate electrode having a gate insulating film and a cap gate insulating film in an active region on the semiconductor substrate, forming L-shaped insulating sidewalls at sides of the gate electrode, forming high density source/drain regions in the semiconductor substrate in the active region using the gate electrode and the L-shaped insulating sidewalls as masks, etching the L-shaped insulating sidewalls into I-shaped insulating sidewalls, and forming lightly doped source/drain regions in the semiconductor substrate active region using the I-shaped insulating sidewalls and the gate electrode as masks.

5 Claims, 5 Drawing Sheets

F I G.2a
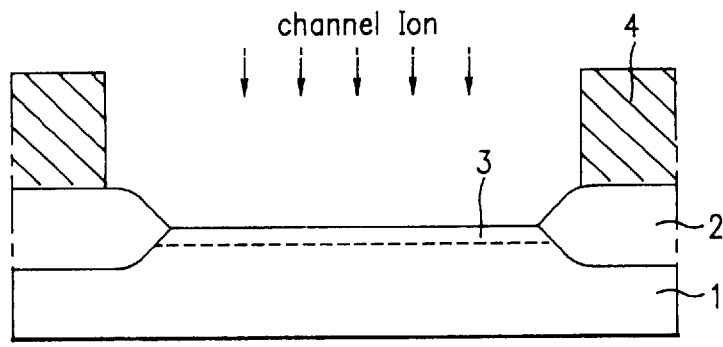
F I G.2b
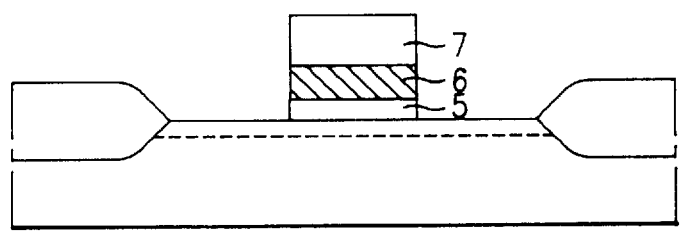
F I G.2c
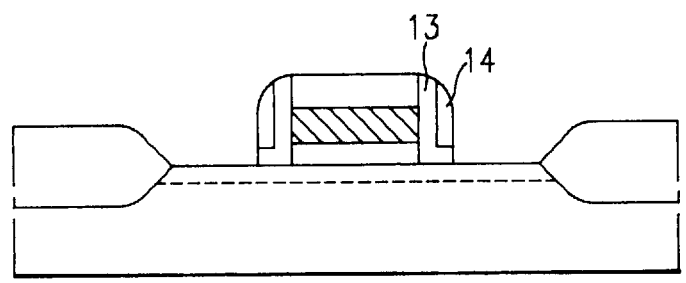

F I G. 2d
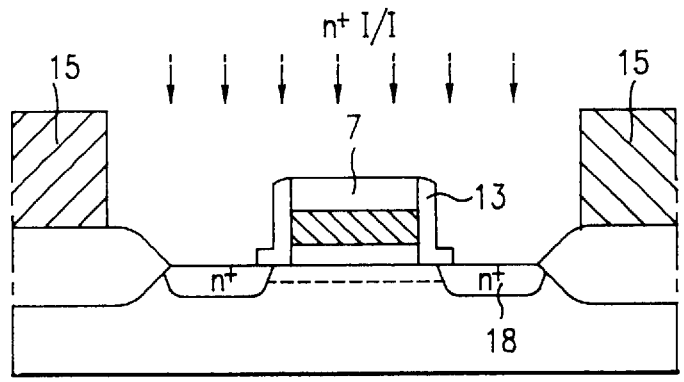
F I G. 2e
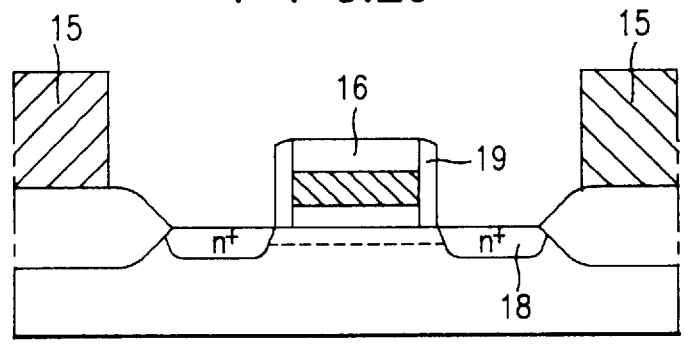
F I G. 2f
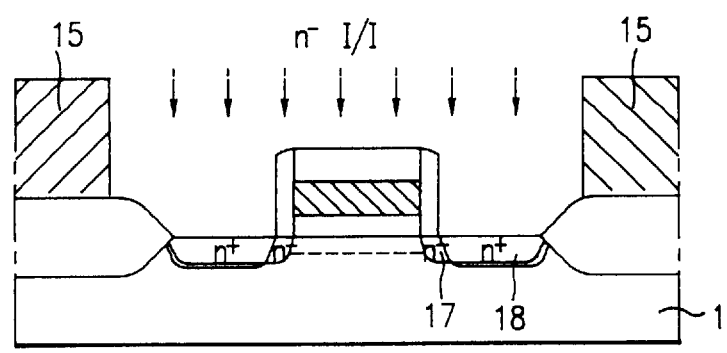
F I G. 2g
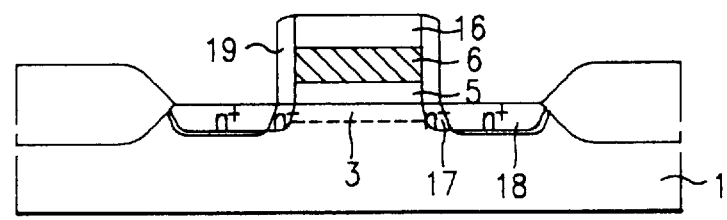

F I G.3
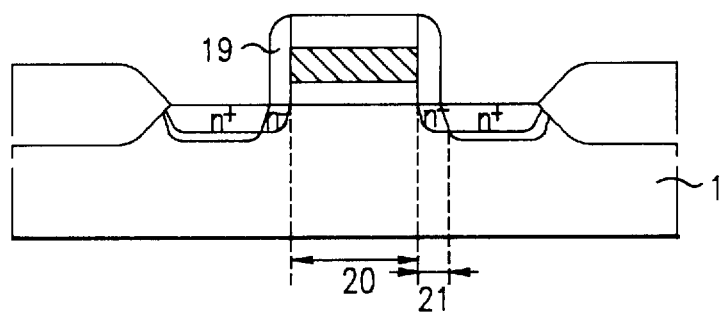

METHOD FOR FABRICATING AN LDD TRANSISTOR

BACKGROUND OF THE INVENTION

This invention relates to a transistor, and more particularly to a method for fabricating an MOS transistor including an LDD structure having reduced short channel effects and GIDL (Gate Induced Drain Leakage). The transistor is further easily integrated on a semiconductor substrate with high packing density.

The basic structure and process of making a conventional LDD MOS transistor will be explained with reference to FIGS. 1a–h.

As shown in FIG. 1a, a field oxide film 2 is formed on a field region of a silicon substrate 1 surrounding an active region. A threshold adjustment implant is then performed through a window formed in photoresist layer 4, resulting in formation of channel region 3.

As shown in FIG. 1b, photoresist film 4 is removed and gate oxide, gate polysilicon, and cap gate oxide layers are deposited successively over the entire surface of substrate 1. These layers are then patterned using photolithography and etching techniques to form a gate electrode including gate oxide film 5, gate polysilicon 6, and cap gate oxide film 7.

As shown in FIG. 1c, using the gate electrode as a mask, impurity ions are implanted at a low dose into the substrate on opposite sides of the gate electrode to form LDD source/drain regions 9. As further shown in FIG. 1c, the low dose implant is performed through a window in photoresist 8, which serves to protect field oxide film 2 during the implantation.

As shown in FIG. 1d, an oxide film is next deposited on the entire surface of the substrate, including the gate electrode. The oxide film is then etched back to form sidewall insulating films 10 or side surfaces of the gate electrode.

As shown in FIG. 1e, using the gate electrode and the sidewall insulating films 10 as masks, a high dose of impurity ions is implanted into the substrate on opposite sides of the gate electrode to form high density source/drain regions 12, and, as shown in FIG. 1f, the conventional LDD MOS transistor is completed.

However, the above-described conventional transistor fabrication method has the following problems. First, the lateral diffusion of the LDD and source/drain implants reduces the channel length of the resulting device, thereby causing short channel effects. Second, the lateral diffusion of these implants increases the amount of overlap between the gate and drain, thereby increasing GIDL (Gate Induced Drain Leakage). Third, the photolithography steps associated with forming the LDD and high impurity concentration source and drain regions are cumbersome and lengthen the overall manufacturing process.

SUMMARY OF THE INVENTION

An object of the present invention is to solve the above problems by providing a method for fabricating an MOS transistor having an LDD structure, which has reduced short channel effects and GIDL and has a simplified fabrication process.

To achieve this object, this invention provides a method for fabricating a transistor including the steps of providing a semiconductor substrate, forming a field oxide film in a field region of the semiconductor substrate, forming a gate electrode having a gate insulating film and a cap gate insulating film over an active region of the semiconductor substrate, forming L-shaped insulating sidewalls at sides of the gate electrode, forming high density source/drain regions in the semiconductor substrate active region using the gate electrode and the L-shaped insulating sidewalls as masks, etching the L-shaped insulating sidewalls into I-shaped insulating sidewalls, and forming lightly doped source/drain regions in the semiconductor substrate in the active region using the I-shaped insulating sidewalls and the gate electrode as masks.

BRIEF DESCRIPTION OF THE DRAWINGS

FIGS. 2a–2g illustrate both a process and resulting MOS transistor having an LDD structure in accordance with a first embodiment of the invention; and FIG. 3 illustrates a sectional view of a MOS transistor having an LDD structure in accordance with a further embodiment of the present invention.

DETAILED DESCRIPTION OF THE PREFERRED EMBODIMENTS

Figure 1A:
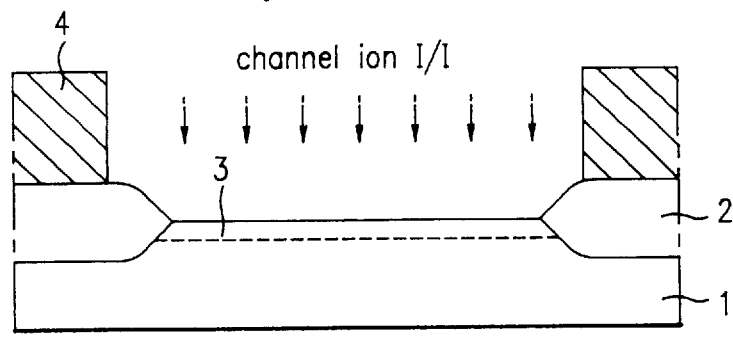
FIGS. 1a–1f illustrate a conventional process for fabricating a conventional MOSFET having a LDD structure.
Figure 1B:
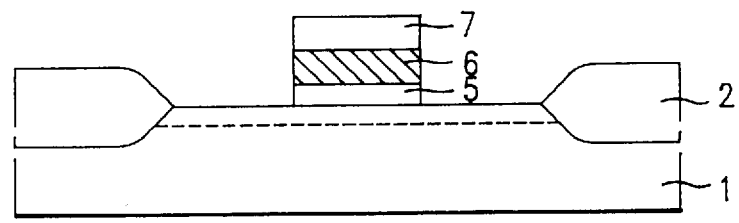
Figure 1C:
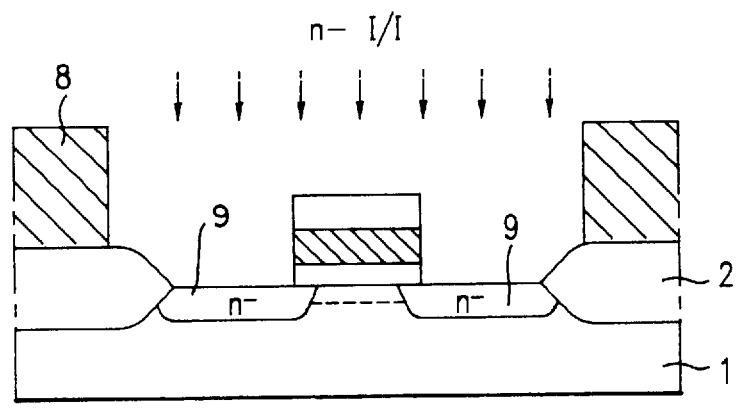
Figure 1D:
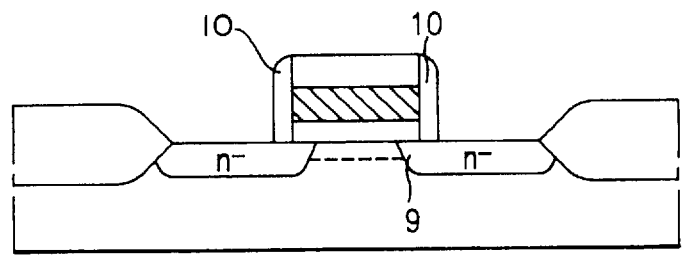
Figure 1E:
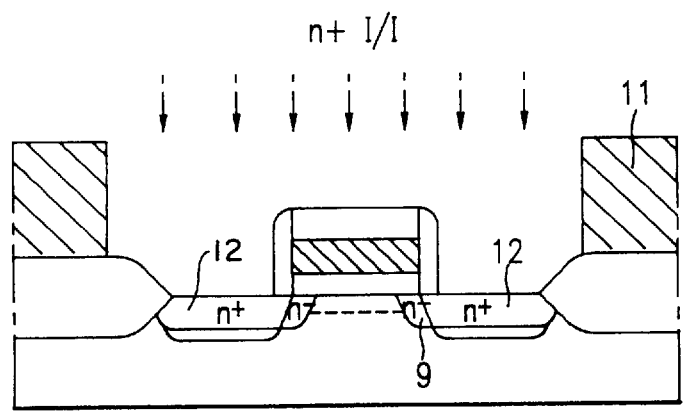
Figure 1F:
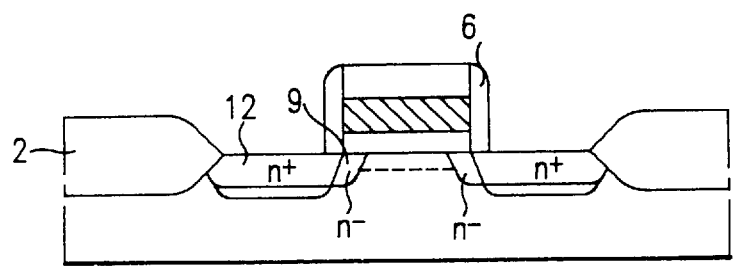

A method for fabricating a transistor in accordance with one preferred embodiment of this invention will now be explained in detail with reference to FIGS. 2a–2g.

As shown in FIG. 2a, a field oxide film is formed on a field region of a silicon substrate 1 while surrounding an active region. A threshold adjustment implant is then performed through a window formed in photoresist layer 4, resulting in formation of channel region 3.

As shown in FIG. 2b, photoresist film 4 is removed and gate oxide, gate polysilicon, and cap gate oxide layers are deposited successively over the entire surface of substrate 1. These layers are then patterned using photolithography and etching techniques to form a gate electrode including gate oxide film 5, gate polysilicon 6, and cap gate oxide film 7.

As shown in FIG. 2c, preferably an oxide film and a nitride film are successively deposited on the substrate including the gate electrode. Alternatively, other materials also having a high etch selectivity can be used. These layers are then etched back to form a bilayered sidewall insulating layer including oxide film sidewall 13 and nitride film sidewall 14 on the sides of the gate electrode.

As shown in FIG. 2d, the nitride film sidewalls 14 are selectively removed, leaving the L-shaped oxide film sidewalls 13 at sides of the gate electrode. A photoresist film is next deposited on and is subjected to exposure and development to form a photoresist pattern on the oxide film 2. Using the gate electrode and the oxide film sidewalls 13 as masks, a high dose of impurity ions is implanted into the silicon substrate, to form high density source/drain regions in the substrate on both opposite sides of the gate electrode.

As shown in FIG. 2e, photoresist pattern 15 remains on oxide film 2 while the L-shaped oxide film sidewalls 13 and the cap gate oxide film 7 are etched to a predetermined thicknesses to form I-shaped oxide film sidewalls 19. Cap gate oxide film 7 is also etched during this step into a thinner cap gate oxide film 16.

As shown in FIG. 2f, using the gate electrode and the I-shaped oxide film sidewalls 19 as masks, a low dose of impurity ions is implanted into the silicon substrate 1 in the active region to form LDD source/drain regions 17. Thereafter, the photoresist 15 is removed, completing a fabrication of the LDD MOS transistor, as shown in FIG. 2g.

The method for fabricating a transistor in accordance with the present invention explained above has the following advantages. First, the transistor fabricated in accordance with the present invention is formed to have an effective channel length that is longer than that achieved by the conventional process. Accordingly, transistors produced in accordance with the present invention have reduced short channel effects.

FIG. 3 illustrates a sectional view of a preferred embodiment MOS transistor having an LDD structure in accordance with this invention. The reference number 20 in FIG. 3 is an effective channel length and the reference number 21 is an overlap length of the gate electrode and the drain.

That is, in the conventional method for fabricating the LDD MOS transistor, the high density source/drain regions are formed after formation of the lightly doped source/drain regions, resulting in lateral diffusion of the lightly doped source/drain regions at the time of formation of the high density source/drain regions. Accordingly, the effective channel length is reduced and GIDL is increased. In accordance with the present invention, however, the high density source/drain regions are formed using the L-shaped oxide film sidewalls as an implantation mask formed before the LDD regions are implanted. Accordingly, reduction of the effective channel length and increased GIDL can be prevented.

Second, the high density source/drain regions are formed with the L-shaped oxide film sidewalls prior to the source/drain implants, and the lightly doped source/drain regions are formed after the L-shaped oxide film sidewalls are removed to form I-shaped oxide film sidewalls without any additional steps. The fabrication process in accordance with the present invention is thus simplified greatly.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a transistor comprising the step of:

forming a field oxide film in a field region surrounding an active region of a semiconductor substrate;

forming a gate electrode having a gate insulating film and a cap gate insulating film on said active region;

forming L-shaped insulating sidewalls on side surfaces of the gate electrode;

forming high density source/drain regions in the semiconductor substrate active region using the gate electrode and the L-shaped insulating sidewalls as masks;

etching the L-shaped insulating sidewall spaces to form I-shaped insulating sidewalls; and forming lightly doped source/drain regions in the semiconductor substrate active region using the I-shaped insulating sidewalls and the gate electrode as masks.

2. A method in accordance with claim 1, wherein the semiconductor substrate is a silicon substrate.

3. A method in accordance with claim 1, further comprising the step of performing a threshold adjustment implant into said active region.

4. The method as claimed in claim 1, wherein the step of forming L-shaped insulating sidewalls at sides of the gate electrode further includes the steps of:

forming first and second insulating films over said surface of said substrate including said gate electrode;

etching back said first and second insulating films to form sidewall spacers, each said sidewall spacers including portions of said first and having a first insulating film sidewall and a second insulating film sidewall; and selectively removing the second insulating sidewalls to form L-shaped first insulating film sidewalls.

5. The method as claimed in claim 4, wherein the first and second insulating sidewalls are formed of materials having a high etch selectivity to the other.

* * * * *